United States Patent
Takenaka

(10) Patent No.: US 12,046,311 B2
(45) Date of Patent: Jul. 23, 2024

(54) SEMICONDUCTOR DEVICE, OTP READOUT CIRCUIT, AND OTP CIRCUIT

(71) Applicant: ROHM CO., LTD., Kyoto (JP)

(72) Inventor: Seiji Takenaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/568,472

(22) Filed: Jan. 4, 2022

(65) Prior Publication Data

US 2022/0130480 A1     Apr. 28, 2022

Related U.S. Application Data

(63) Continuation of application No. PCT/JP2020/023082, filed on Jun. 11, 2020.

(30) Foreign Application Priority Data

Jul. 5, 2019 (JP) ................................. 2019-125829

(51) Int. Cl.
    *G11C 17/18*    (2006.01)
    *G11C 17/16*    (2006.01)

(52) U.S. Cl.
    CPC ............. *G11C 17/18* (2013.01); *G11C 17/16* (2013.01)

(58) Field of Classification Search
    CPC ................................ G11C 17/18; G11C 17/16
    USPC .................................................. 365/185.04
    See application file for complete search history.

(56) References Cited

U.S. PATENT DOCUMENTS

| 2003/0147287 | A1 | 8/2003 | Lee |
| 2005/0156919 | A1 | 7/2005 | Muraki |
| 2013/0077377 | A1* | 3/2013 | Kim ...................... G11C 17/16 365/104 |
| 2013/0170276 | A1 | 7/2013 | Daigle |
| 2013/0308364 | A1 | 11/2013 | Smith |
| 2016/0005492 | A1 | 1/2016 | Barsilai |
| 2016/0329107 | A1* | 11/2016 | Ryu ......................... G11C 7/02 |
| 2018/0060164 | A1* | 3/2018 | Pandey ................... G06F 12/10 |
| 2018/0090202 | A1* | 3/2018 | Kaminaga .............. G11C 16/26 |

FOREIGN PATENT DOCUMENTS

| JP | 2003132691 A | 5/2003 |
| JP | 2003242795 A | 8/2003 |
| JP | 2005195746 A | 7/2005 |
| JP | 2015520473 A | 7/2015 |

OTHER PUBLICATIONS

International Search Report for International Application No. PCT/JP2020/023082; Date of Mailing, Sep. 1, 2020.
JPO Notice of Reasons for Refusal for corresponding JP Application No. 2021-530544; Issued May 7, 2024; 8 pages.

* cited by examiner

*Primary Examiner* — Huan Hoang
(74) *Attorney, Agent, or Firm* — CANTOR COLBURN LLP

(57) ABSTRACT

An OTP readout circuit includes an OTP circuit having a first OTP cell in which data is programmable only once, and a readout-possible signal output unit configured to generate a readout-possible voltage for reading out the data and output the generated readout-possible voltage to the OTP circuit. The readout-possible voltage from the readout-possible signal output unit causes the OTP circuit to read out the data programmed into the first OTP cell.

8 Claims, 8 Drawing Sheets

SEMICONDUCTOR DEVICE, OTP READOUT CIRCUIT, AND OTP CIRCUIT

CROSS REFERENCE TO RELATED APPLICATIONS

This application is a continuation under 35 U.S.C. § 120 of PCT/JP2020/023082, filed Jun. 11, 2020, which is incorporated herein by reference and which claimed priority to Japanese Application No. 2019-125829 filed Jul. 5, 2019. The present application likewise claims priority under 35 U.S.C. § 119 to Japanese Application No. 2019-125829, filed Jul. 5, 2019, the entire content of which is also incorporated herein by reference.

BACKGROUND OF THE INVENTION

1. Field of the Invention

Embodiments relate to a semiconductor device, an OTP readout circuit, and an OTP circuit.

2. Description of the Related Art

In an LSI (large-scale integrated circuit) provided with an OTP circuit having an OTP (one-time programmable) cell, when power is turned on and a power source voltage becomes equal to a reference voltage of a reference voltage source, a reset release signal for resetting the power-on is output to a control circuit. The control circuit operates due to the reset release signal, and the OTP circuit also operates by the reset release signal. The control circuit programs data into the OTP cell, reads out the data from the OTP cell, and outputs the read out data as trimming information.

However, since the reference voltage of a reference voltage source varies, the reset release signal is not output to the control circuit and the OTP circuit unless an upper limit value reaches 2.1 V, for example. For this reason, even if a read voltage of the OTP cell is, for example, 1.8 V, data cannot be read out from the OTP cell because the reset is not canceled.

SUMMARY OF THE INVENTION

According to one aspect of the present embodiment, a semiconductor device includes a first storage element configured to store data; and a readout-possible signal output unit including a second storage element having the same configuration as that of the first storage element, and configured to determine that the data of the first storage element can be read out, based on a state of the second storage element, and output a readout-possible signal.

According to one aspect of the present embodiment, an OTP circuit comprises a first OTP cell in which data is programmable only once; and a constant current source from which a constant current flows. The first OTP cell includes a first transistor in which a current is supplied from the constant current source to a first gate and a first source is connected to ground via a first resistor; and a memory transistor in which a current is supplied from the constant current source to a second gate and a second source is connected to ground, the first transistor and the memory transistor constitute a current mirror circuit, and the OTP circuit causes a current to be supplied by the constant current source, gradually increases a gate-source voltage Vth1 of the memory transistor and a gate-source voltage Vth2 of the first transistor, and after a current flows through the first transistor, the OTP circuit reads out the data programmed into the memory transistor at a voltage at which a program magnification is approximately maximum using a difference between the Vth1 and Vth2, the program magnification representing a fluctuation rate of an amount of current before and after data is programmed.

DETAILED DESCRIPTION OF THE INVENTION

Figure 1:
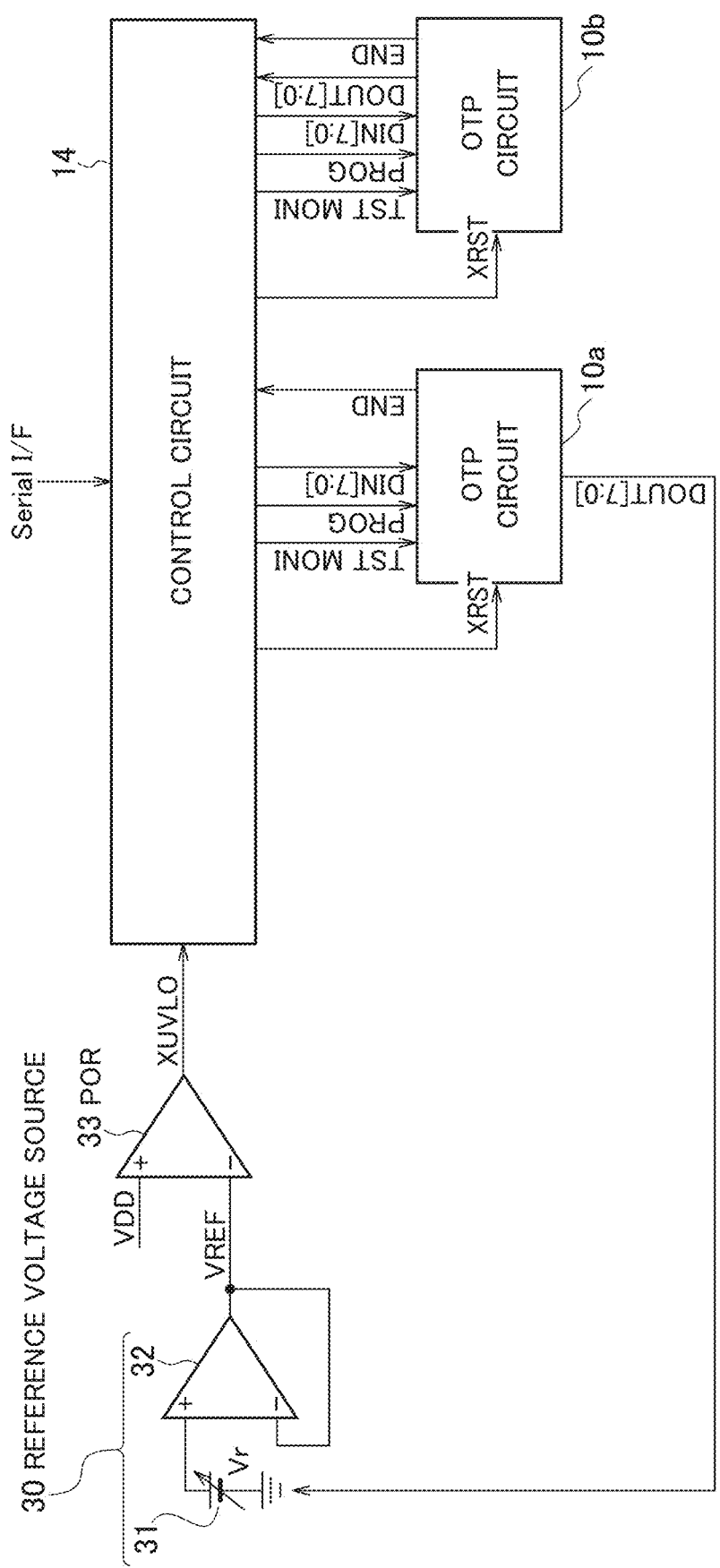
FIG. 1 is a diagram illustrating a basic configuration of an LSI including an OTP circuit according to an embodiment.

Hereinafter, a semiconductor device and an OTP readout circuit according to an embodiment will be described in detail with reference to the drawings. The drawings to be referred to are schematic. In the following description, elements having the same function and structure are denoted by common reference numerals.

First Embodiment

A semiconductor device according to an embodiment comprises: a first storage element configured to store data; and a readout-possible signal output unit including a second storage element having the same configuration as the first storage element, and configured to determine that the data of the first storage element can be read out, based on the state of the second storage element, and output a readout-possible signal. Each of the first storage element and the second storage element is a nonvolatile memory such as an OTP cell comprising memory cells, a PROM (programmable ROM), an EPROM (erasable programmable ROM), an EEPROM (electrically erasable programmable ROM), and a flash memory.

According to the semiconductor device of the embodiment, the readout-possible signal output unit determines that the data of the first storage element can be read out, based on the state of the second storage element, and outputs a readout-possible signal. For this reason, the data of the first storage element can be read out by the semiconductor device itself.

Hereinafter, in a case where the first storage element and the second storage element of the semiconductor device are OTP cells, an OTP circuit including the OTP cells and an OTP readout circuit for reading out data stored in the OTP cells will be described. FIG. 1 is a diagram illustrating a basic configuration of an LSI including an OTP circuit according to the embodiment. The LSI comprise a reference voltage source 30 including a variable power source 31 and an operational amplifier 32, a power-on reset circuit (POR circuit) 33, a control circuit 14, and OTP circuits 10a and 10b connected to the control circuit 14.

Each of the OTP circuits 10a and 10b has a plurality of OTP cells, and each OTP cell can program (write) 1-bit data and read out data. The OTP circuits 10a and 10b are composed of, for example, 8-bit data.

The reference voltage source 30 outputs a reference voltage to an inverting input terminal (−) of the POR circuit 33. The POR circuit 33 includes a comparator, compares a voltage VDD input to a non-inverting input terminal (+) with a reference voltage VREF input to the inverting input terminal, and outputs a reset release signal XUVLO to the control circuit 14 when the voltage VDD becomes equal to the reference voltage.

The control circuit 14 includes a digital circuit. The control circuit 14 is activated by a reset release signal, and outputs the reset release signal to the OTP circuits 10a and 10b. The OTP circuits 10a and 10b are operated according to the reset release signal. The control circuit 14 programs data (PROG) into the OTP cells in the OTP circuits 10a and 10b, and also inputs an input signal (DIN) and reads out data by 1 bit at a time and an END signal from the OTP cells in the OTP circuits 10a and 10b.

Further, the control circuit 14 can also convert digital data read out from the OTP cells in the OTP circuit 10a into analog data and output the analog data as trimming information for varying the voltage of the reference voltage source 30.

Figure 2:
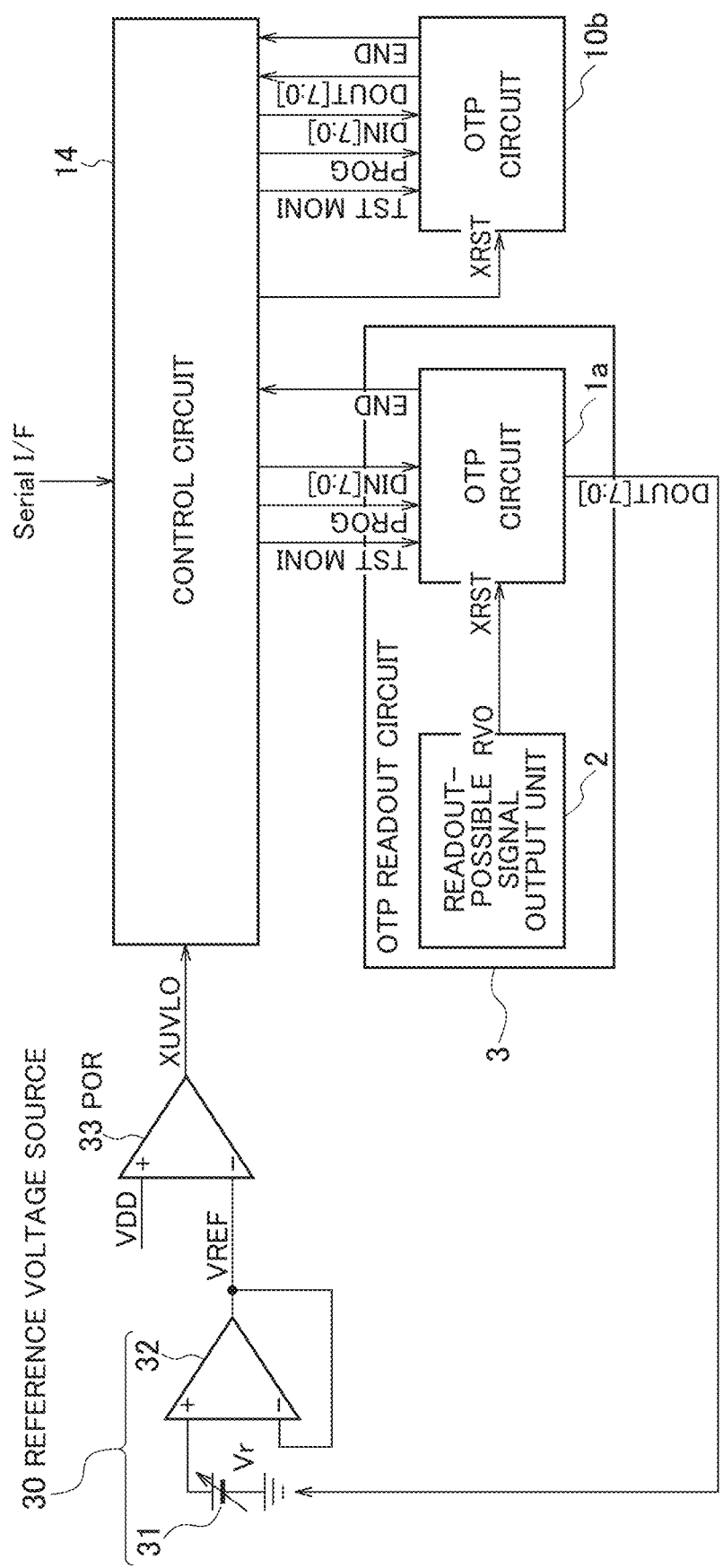
FIG. 2 illustrates an LSI provided with an OTP readout circuit according to a first embodiment.

FIG. 2 illustrates an LSI provided with the OTP readout circuit according to the first embodiment. In the LSI illustrated in FIG. 1, the OTP circuit 10a reads out data programmed into the OTP cells in accordance with the reset release signal from the control circuit 14, but the OTP readout circuit 3 according to the first embodiment illustrated in FIG. 2 reads out data from the OTP cells by means of the OTP readout circuit 3 itself without inputting the reset release signal from the control circuit 14, even if the reference voltage of the reference voltage source 30 varies.

Since the LSI illustrated in FIG. 2 is different in terms of the OTP readout circuit 3 from the LSI illustrated in FIG. 1, the OTP readout circuit 3 will be mainly described here. The OTP readout circuit 3 includes an OTP circuit 1a connected to the control circuit 14, and a readout-possible signal output unit 2 connected to the OTP circuit 1a.

The OTP circuit 1a has a plurality of OTP cells, and each OTP cell can program 1-bit data and read out data. The OTP circuit 1a is composed of, for example, 8-bit data.

The control circuit 14 programs the data (PROG) into the OTP cells in the OTP circuits 1a and 10b. Further, the control circuit 14 inputs an input signal (DIN), and reads out the data by 1 bit at a time and an END signal from the OTP circuits 1a and 10b.

The control circuit 14 can also convert digital data read out from the OTP circuit 1a into analog data and output the analog data to the reference voltage source 30 as trimming information.

The OTP circuit 1a has an OTP cell in which data is programmable only once. The readout-possible signal output unit 2 generates a readout-possible voltage for reading out the data programmed into the OTP cell in the OTP circuit 1a, and outputs the generated readout-possible voltage to the OTP circuit 1a. The readout-possible voltage from the readout-possible signal output unit 2 causes the OTP circuit 1a to read out the data programmed into the OTP cell.

Figure 3:
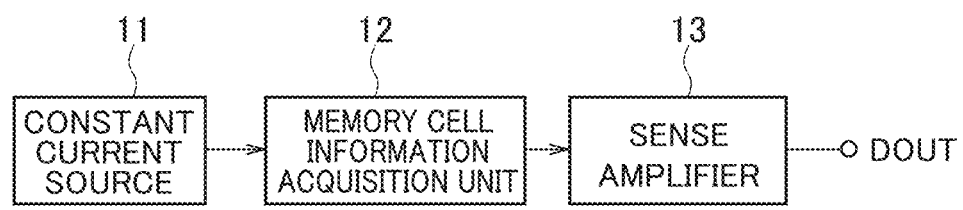
FIG. 3 is a schematic configuration diagram of an OTP circuit included in the OTP readout circuit according to the first embodiment.
Figure 4:
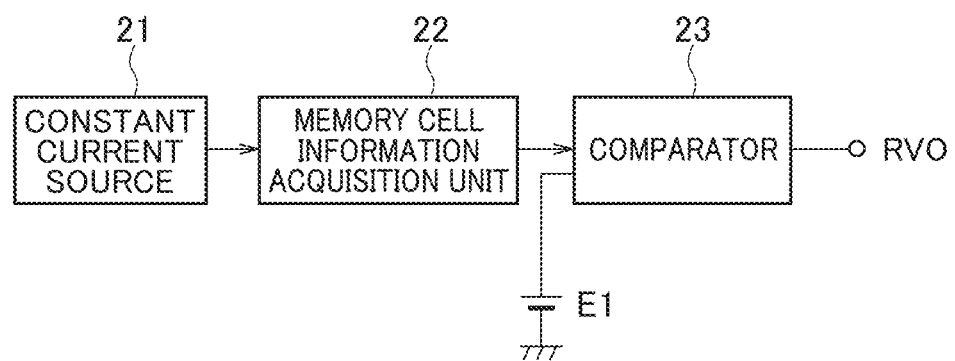
FIG. 4 is a schematic configuration diagram of a readout-possible voltage output unit included in the OTP readout circuit according to the first embodiment.

As illustrated in FIG. 3, the OTP circuit 1a schematically includes a constant current source 11, a memory cell information acquisition unit 12 having the OTP cells, and a sense amplifier 13. The constant current source 11 increases a voltage applied to the OTP cells by supplying a constant current to the memory cell information acquisition unit 12, and supplies a constant current to the OTP cells. When a constant current flows through the OTP cells, the sense amplifier 13 reads out and outputs the data programmed into the OTP cells.

The readout-possible signal output unit 2 includes a constant current source 21, a memory cell information acquisition unit 22 having the OTP cells, and a comparator 23. The constant current source 21 has the same configuration as the constant current source 11 of the OTP circuit 1a. The OTP cells included in the memory cell information acquisition unit 22 have the same configuration as the OTP cells included in the memory cell information acquisition unit 12 of the OTP circuit 1a.

The constant current source 21 increases a voltage applied to the OTP cells by supplying a constant current to the memory cell information acquisition unit 22, and supplies a constant current to the OTP cells. When an output voltage of the memory cell information acquisition unit 22 is equal to or higher than a reference voltage E1 (for example, 1 V), the comparator 23 outputs to an XRST terminal of the OTP circuit 1a, a readout-possible voltage RVO for reading out data programmed into the OTP cells of the memory cell information acquisition unit 12.

According to the OTP readout circuit 3 of the first embodiment configured as described above, a constant current flows through the memory cell information acquisition unit 22 in the readout-possible signal output unit 2, a voltage applied to the OTP cells increases, and a constant current flows through the OTP cells. Then, the comparator 23 outputs to the XRST terminal of the OTP circuit 1a, the readout-possible voltage RVO for reading out the data of the OTP cells in the memory cell information acquisition unit 12.

In the OTP circuit 1a, when the readout-possible voltage RVO is input to the XRST terminal, the constant current source 11 operates, a constant current flows through the memory cell information acquisition unit 12, and a constant current flows through the OTP cells. That is, since the OTP cells included in the memory cell information acquisition unit 12 and the OTP cells included in the memory cell information acquisition unit 22 have the same configuration, the readout-possible voltage of the OTP cells included in the memory cell information acquisition unit 12 is the same as the readout-possible voltage of the OTP cells included in the memory cell information acquisition unit 22. This makes it possible to read out the data of the OTP cells using the readout-possible voltage from the readout-possible signal output unit 2.

Accordingly, the OTP readout circuit 3 can read out data from the OTP cells in the OTP circuit 1a by means of the OTP readout circuit 3 itself without inputting a reset release signal from an external component such as the control circuit 14 and even if the reference voltage of the reference voltage source 30 varies. Accordingly, even if the power source voltage required for the operation of the other circuits is not reached, the OTP readout circuit 3 can read out the data of the OTP cells at a voltage lower than the above power source voltage, and trimming can be performed immediately after an LSI is turned on.

(Specific Configuration Example of OTP Readout Circuit 3)

Figure 5:
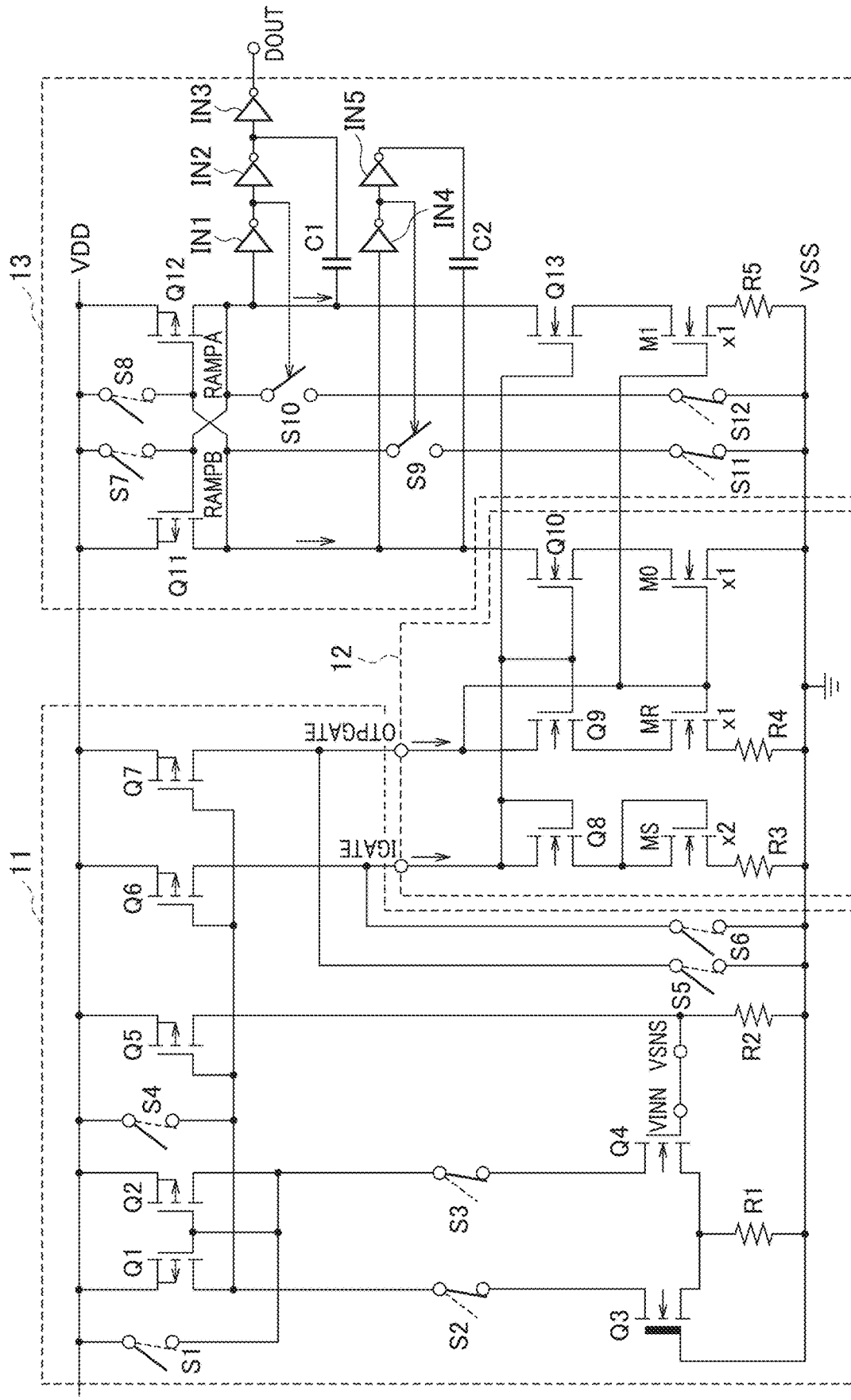
FIG. 5 is a specific circuit configuration diagram of the OTP circuit illustrated in FIG. 3.

Next, a specific configuration example of the OTP readout circuit 3 will be described. FIG. 5 is a specific circuit configuration diagram of the OTP circuit 1a illustrated in FIG. 3. In FIG. 5, the constant current source 11 includes MOSFETs Q1 to Q7, switches S1 to S6, and resistors R1 to R2. The MOSFETs Q1, Q2, Q5, Q6, and Q7 are composed of P channels, and their sources are connected to a power source VDD. The MOSFETs Q3, Q4 are composed of N channels, and their sources are connected to ground VSS via a resistor R1. The gate of the MOSFET Q3 is connected to the ground VSS, and the gate of the MOSFET Q4 is connected to the ground VSS via a resistor R2. The configuration of the MOSFET Q3 is different from that of the MOSFET Q4.

The memory cell information acquisition unit 12 includes MOSFETs Q8 to Q10, a transistor MS, a transistor MR, resistors R3 and R4, and an OTP memory transistor M0 (equivalent to an OTP cell and memory transistor). A series circuit of the MOSFET Q8, the transistor MS, and the resistor R3 is connected between the drain of the MOSFET Q6 and the ground VSS. A series circuit of the MOSFET Q9, the transistor MR (equivalent to the first transistor), and the resistor R4 is connected between the drain of the MOSFET Q7 and the ground VSS.

The gate of the transistor MR and the gate of the OTP memory transistor M0 (equivalent to an OTP cell and memory transistor) are connected to the drain of the MOSFET Q7. The source of the transistor MR is connected to the ground via the resistor R4, and the source of the OTP memory transistor M0 is connected to the ground.

The drain of the transistor MR is connected to the source of the MOSFET Q9, and the drain of the OTP memory transistor M0 is connected to the source of the MOSFET Q10. That is, the transistor MR and the OTP memory transistor M0 constitute a current mirror circuit.

The sense amplifier 13 includes MOSFETs Q11 to Q13, an OTP memory transistor M1, switches S7 to S12, a resistor R5, capacitors C1 and C2, and inverters IN1 to IN5. The MOSFET Q11, the MOSFET Q10, and the OTP memory transistor M0 are connected between the power source VDD and the ground VSS. The MOSFET Q12, the MOSFET Q13, and the OTP memory transistor M1 are connected between the power source VDD and the ground VSS.

The MOSFET Q11 and the MOSFET Q12 constitute a flip-flop circuit. Data read out from the OTP memory transistor M0 is output from a DOUT terminal via the inverters IN1 to IN3.

Figure 6:
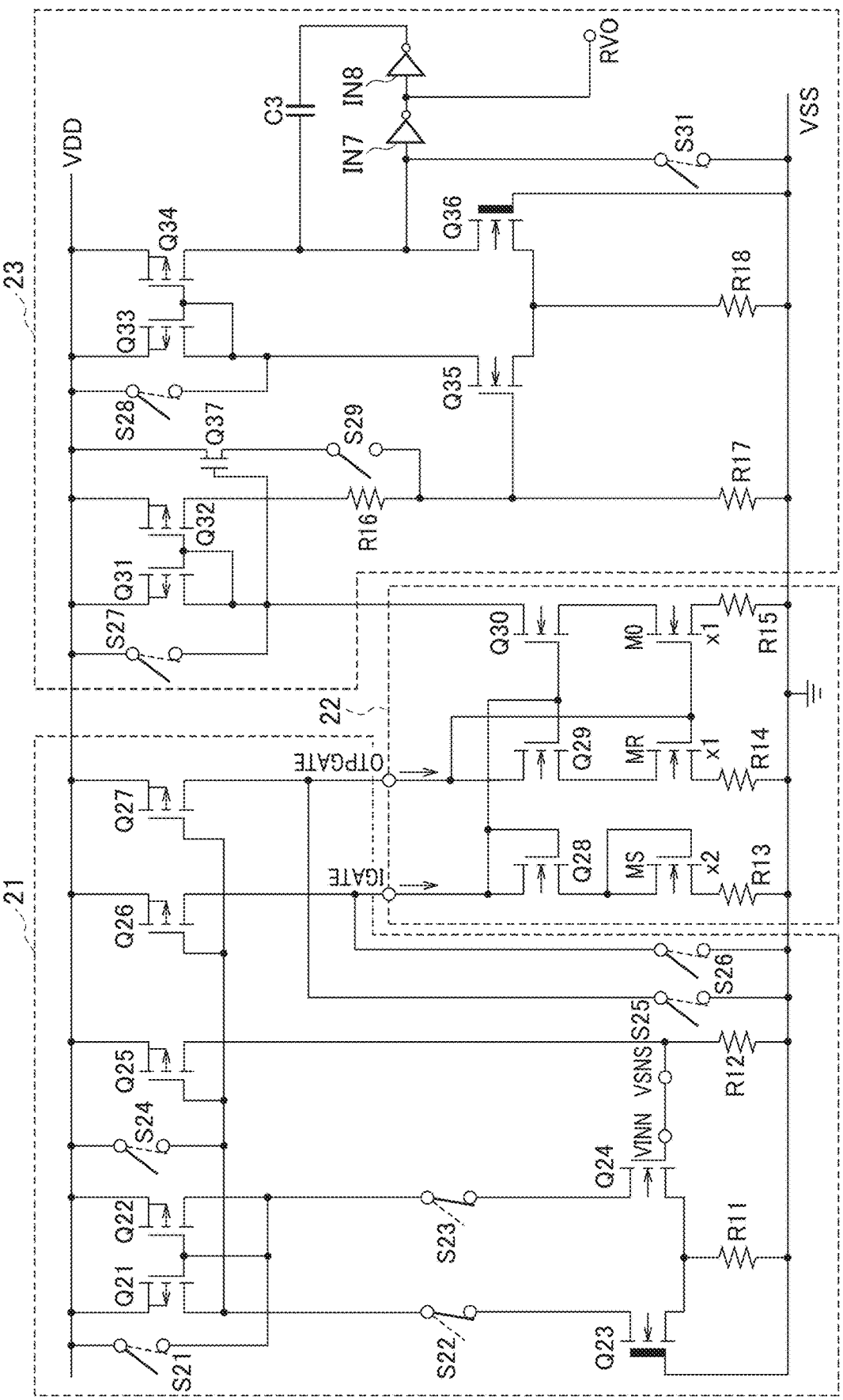
FIG. 6 is a specific circuit configuration diagram of the readout-possible voltage output unit illustrated in FIG. 4.

FIG. 6 is a specific circuit configuration diagram of the readout-possible signal output unit 2 illustrated in FIG. 3. In FIG. 6, the constant current source 21 includes MOSFETs Q21 to Q27, switches S21 to S26, and resistors R11 to R12. The MOSFETs Q21, Q22, Q25, Q26, and Q27 are composed of P channels, and their sources are connected to the power source VDD. The MOSFETs Q23 and Q24 are composed of N channels, and their sources are connected to the ground VSS via the resistor R11. The gate of the MOSFET Q23 is connected to the ground VSS, and the gate of the MOSFET Q24 is connected to the ground VSS via the resistor R12. The configuration of the MOSFET Q23 is different from that of the MOSFET Q24.

The memory cell information acquisition unit 22 includes MOSFETs Q28 to Q30, the transistor MS, the transistor MR, the OTP memory transistor M0 (equivalent to an OTP cell), and resistors R13 to R15. A series circuit of the MOSFET Q28, the transistor MS, and the resistor R13 is connected between the drain of the MOSFET Q26 and the ground VSS. A series circuit of the MOSFET Q29, the transistor MR, and the resistor R14 is connected between the drain of the MOSFET Q27 and the ground VSS.

The transistor MS, the transistor MR, and the OTP memory transistor M0 in the memory cell information acquisition unit 22 illustrated in FIG. 6 have the same configuration as the transistor MS, the transistor MR, and the OTP memory transistor M0 in the memory cell information acquisition unit 12 illustrated in FIG. 5.

The comparator 23 includes MOSFETs Q31 to Q37, switches S27 to S31, resistors R16 to R18, a capacitor C3, and inverters IN7 to IN8. The source of the MOSFET Q31, the source of the MOSFET Q32, the source of the MOSFET Q33, the source of the MOSFET Q34, and the source of the MOSFET Q37 are connected to the power source VDD.

A series circuit of the MOSFET Q30, the OTP memory transistor M0, and the resistor R15 is connected between the drain of the MOSFET Q31 and the ground VSS. A series circuit of the resistor R16 and the resistor R17 is connected between the drain of the MOSFET Q32 and the ground VSS. The gate of the MOSFET Q37 is connected to the gate of the MOSFET Q31 and the gate of the MOSFET Q32. The drain of the MOSFET Q37 is connected to one end of the switch S29, and the other end of the switch S29 is connected between the resistor R16 and the resistor R17. The voltage of the power source VDD can be detected with the ratio of the resistor R16 and the resistor R17, and can be detected even when the voltage of the power source VDD is very low.

The drain of the MOSFET Q33 is connected to the drain of the MOSFET Q35, the drain of the MOSFET Q34 is connected to the drain of the MOSFET Q36, and the source of the MOSFET Q35 and the source of the MOSFET Q36 are connected to the ground VSS via the resistor R18.

The gate of the MOSFET Q36 is connected to the ground VSS, and the gate of the MOSFET Q35 is connected to the ground VSS via the resistor R17. The configuration of the MOSFET Q35 is different from that of the MOSFET Q36. The readout-possible voltage RVO is output from the inverter IN7 connected to the drain of the MOSFET Q36.

Next, an operation of the readout-possible signal output unit 2 and reading out of data in the OTP circuit 1a will be described with reference to FIG. 5 and FIG. 6.

First, in the constant current source 21 of the readout-possible signal output unit 2, when the switches S22 and S23 are turned on, the MOSFETs Q21, Q22, Q23, Q24, Q25, Q26, and Q27 are turned on. Since the gate of the MOSFET Q23 is connected to the ground and the gate of the MOSFET Q24 is connected to the resistor R12, a potential difference Vth is generated between the gate of the MOSFET Q23 and the gate of the MOSFET Q24. The potential difference Vth serves as a constant voltage source, and the constant voltage source causes a current to flow through the MOSFETs Q25, Q26, and Q27.

The gate potentials of the MOSFETs Q28, Q29, and Q30 are increased by the current flowing through the MOSFET Q26. Accordingly, a current flows in the path of the MOSFET Q26→the MOSFET Q28→the transistor MS→the resistor R13. In addition, a current flows in the path of the MOSFET Q27→the MOSFET Q29→the transistor MR→the resistor R14.

The gate potential of the MOSFET Q30 and the gate potential of the OTP memory transistor M0 increase, and a current flows in the path of the MOSFET Q31→the MOSFET Q30→the OTP memory transistor M0→the resistor R15. Then, a current flows from the MOSFET Q32 to the resistors R16 and R17. Since a current flowing through the resistor R17 and a voltage generated by the resistor R17 are applied to the gate of the MOSFET Q35, and since the gate of the MOSFET Q36 is connected to the ground, the potential difference Vth is generated between the gate of the MOSFET Q35 and the gate of the MOSFET Q36.

The potential difference Vth becomes equal to the reference voltage E1 of the comparator 23, and the voltage produced when a constant current flows through the transistor MS, the transistor MR, and the OTP memory transistor M0, that is, a readout-possible voltage (a voltage lower than the voltage VDD) is compared with the potential difference Vth which is the reference voltage E1 (for example, 1 V). When the readout-possible voltage is less than the potential difference Vth, the readout-possible voltage is not output from the inverter IN7 to the RVO terminal, but when the readout-possible voltage is equal to the potential difference Vth or more, the readout-possible voltage is output from the inverter IN7 to the RVO terminal.

Figure 7:
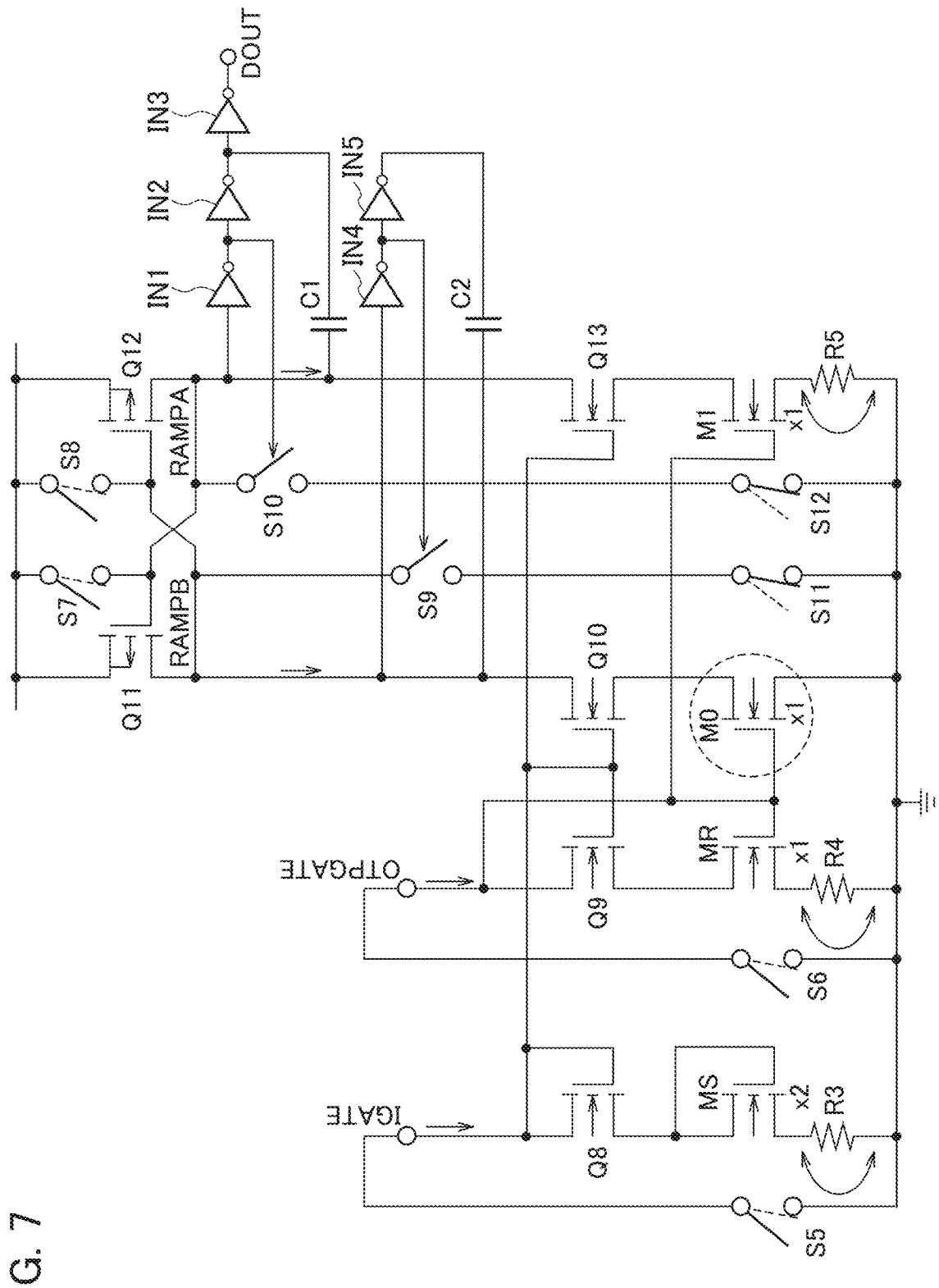
FIG. 7 is a diagram for explaining an operation at the time of reading out data of a specific circuit of the OTP circuit illustrated in FIG. 3.

Next, reading out of data in the OTP circuit 1a illustrated in FIG. 5 and FIG. 7 will be described. When a readout-possible voltage is input to the OTP circuit 1a, the switches S2 and S3 are turned on, and the MOSFETs Q1, Q2, Q3, Q4, Q5, Q6, and Q7 are turned on. Since the gate of the MOSFET Q3 is connected to the ground and the gate of the MOSFET Q4 is connected to the resistor R1, the potential difference Vth is generated between the gate of the MOSFET Q3 and the gate of the MOSFET Q4. The potential difference Vth serves as a constant voltage source, and the constant voltage source causes a current to flow through the MOSFETs Q5, Q6, and Q7.

The gate potentials of the MOSFETs Q8, Q9, and Q10 are increased by the current flowing through the MOSFET Q6. Accordingly, a current IGATE flows through the path of the MOSFET Q6→the MOSFET Q8→the transistor MS→the resistor R3. In addition, a current flows through the path of the MOSFET Q7→the MOSFET Q9→the transistor MR→the resistor R4.

Since one end of the resistor R4 is connected to the source of the transistor MR and the source of the OTP memory transistor M0 is connected to the ground VSS, a large current flows through the OTP memory transistor M0 while little current flows through the transistor MR. When a large current flows through the OTP memory transistor M0, the data "1" can be read out from the OTP memory transistor M0 to the DOUT terminal.

Figure 8:
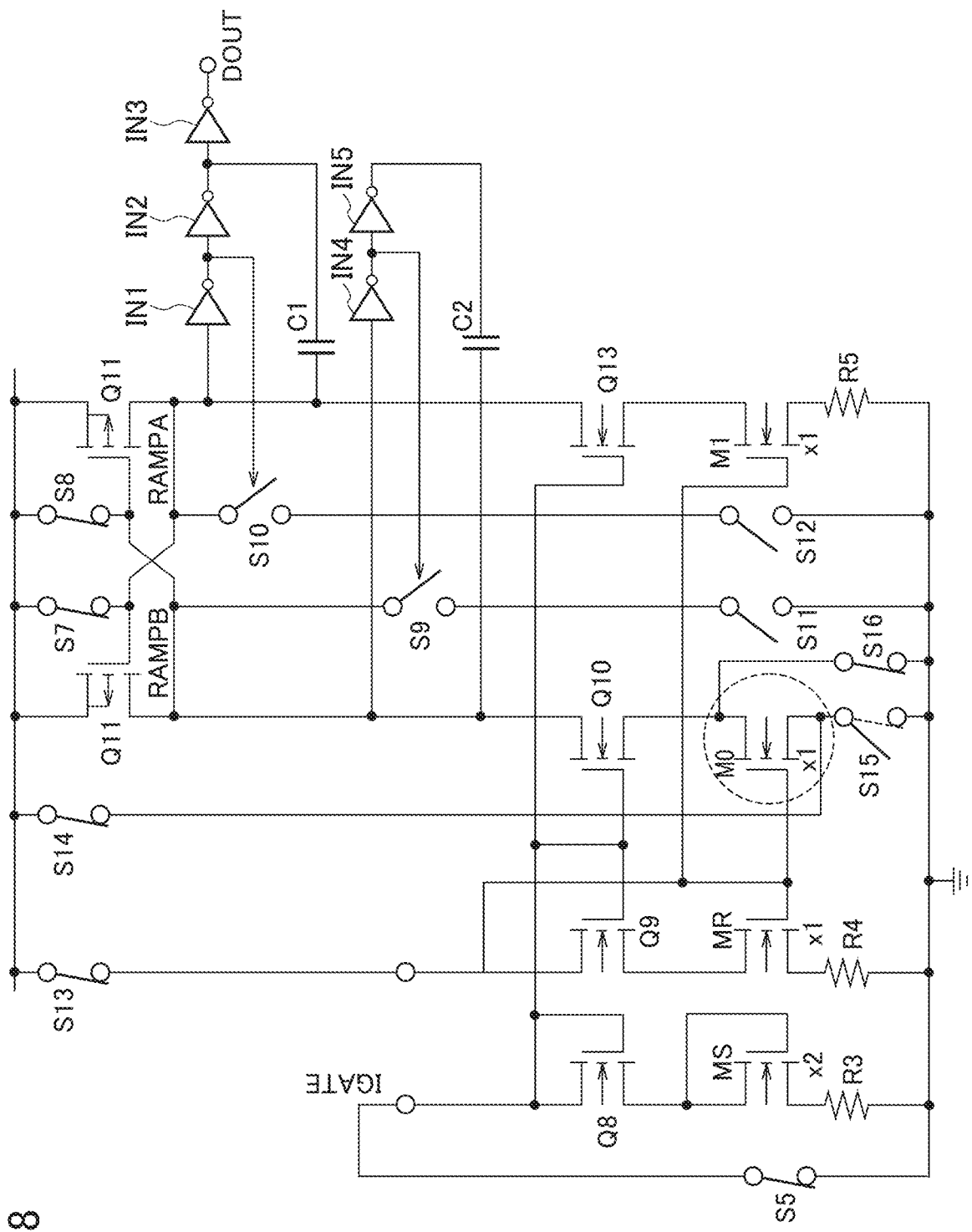
FIG. 8 is a diagram for explaining an operation at the time of programming data of a specific circuit of the OTP circuit illustrated in FIG. 3.

FIG. 8 is a diagram for explaining an operation at the time of programming data of a specific circuit of the OTP circuit 1a illustrated in FIG. 3. In the configuration at the time of programming data in FIG. 8, switches S13 to S16 are added to the configuration at the time of reading data in FIG. 7. The switch S13 is connected between a writing voltage and the drain of the MOSFET Q9, and the switch S14 is connected between a writing voltage and the source of the OTP memory transistor M0. One end of the switch S15 is connected to the source of the OTP memory transistor M0, and the other end is connected to the ground. One end of the switch S16 is connected to the drain of the OTP memory transistor M0, and the other end is connected to the ground. The writing voltage is, for example, 7 V and is supplied from the control circuit 14.

When data is programmed into the OTP memory transistor M0, the switches S13, S14, and S16 are turned on. Then, since 7 V is applied to the gate and source of the OTP memory transistor M0 and 0 V is applied to the drain of the OTP memory transistor M0, the OTP memory transistor M0 is turned on, and a large current flows into the OTP memory transistor M0. Accordingly, data is programmed into the OTP memory transistor M0.

The data programmed into the OTP cells may be trimming information for correcting the reference voltage of the reference voltage source 30. The reference voltage can be corrected by reading out this trimming information from the OTP cells and correcting the voltage of the variable power source 31.

Further, the data programmed into the OTP cells is not limited to the trimming information. The data programmed into the OTP cells may, for example, program into the OTP cells, correction information for external devices such as a display panel or a camera, and the OTP readout circuit may read out the programmed correction information to correct parameters of the display panel or the camera using such correction information.

Further, the data programmed into the OTP cells may be information for correcting (trimming) manufacturing variations in sensors (pressure sensors, gyros, etc.), information for correcting manufacturing variations in LEDs, information for correcting a driver for driving a power transistor in accordance with a power transistor, information for correcting variations in an IC itself and improving the output accuracy of the IC, information for changing a starting sequence depending on a set, information for correcting characteristics depending on the temperature of components, information that can be traced back to the time of manufacture such as lot numbers of wafers (Wa. Lot. Nos.) and assembly lot numbers (Lot. Nos.), information regarding set abnormalities detected and what protection has been performed to shut down the system, and information for correcting an initial position in the motor drive. All such information may be programmed into the OTP cells and read out from the OTP cells.

Second Embodiment

Next, an OTP circuit according to a second embodiment will be described. In the OTP circuit 1a illustrated in FIG. 5, the amount of current after the data is programmed into the OTP memory transistor M0 greatly varies in comparison with the amount of current before the data is programmed. In this respect, the fluctuation rate of the amount of current before and after data is programmed is referred to as a program magnification.

The potential difference Vth between the gate and the source of the OTP memory transistor M0 after data is programmed shifts, for example, from 0.8 V to 2 V from before to after being programmed. The potential difference Vth saturates at a voltage at which the program magnification becomes maximum.

For this reason, data is read out using the difference of the potential difference Vth in order to make it easy to read out data at a voltage at which the program magnification becomes maximum. Accordingly, a current mirror circuit including the transistor MR and the OTP memory transistor M0 illustrated in FIG. 6 is employed.

When data programmed into the OTP memory transistor M0 is read out, the constant current source 11 including a bias circuit supplies a constant current to the transistor MR and the OTP memory transistor M0 to gradually increase a gate-source voltage Vgs=a drain-source voltage Vds of the transistor MR and the OTP memory transistor M0.

At this time, the current flows firstly through the transistor MR having a low potential difference Vth1 (first threshold voltage), and the current flows later through the programmed OTP memory transistor M0 having a high potential difference Vth2 (second threshold voltage). Accordingly, after the current flows through the transistor MR, the data programmed into the OTP memory transistor M0 can be read out at a voltage at which the program magnification becomes approximately maximum.

Figure 9:
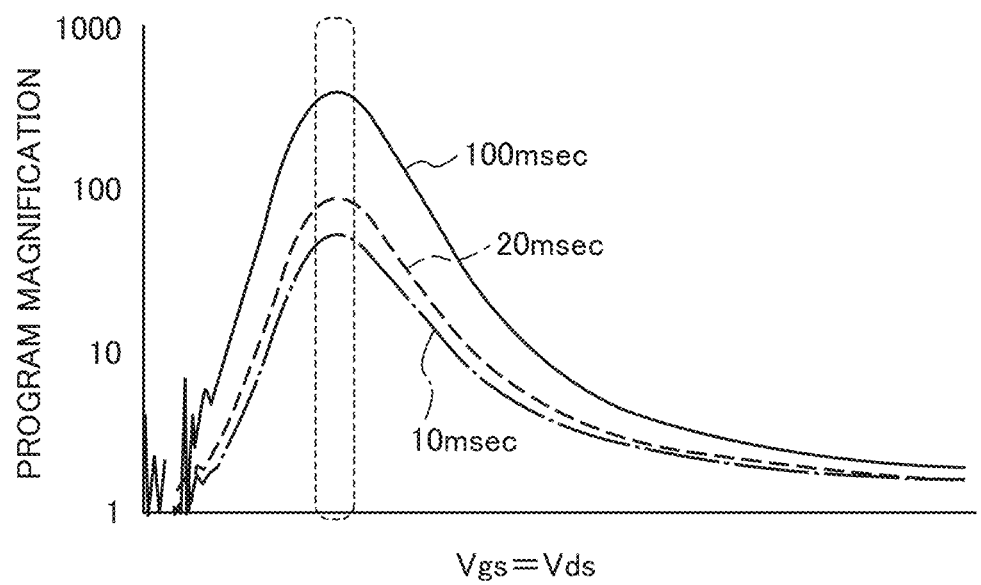
FIG. 9 is a diagram illustrating how reading conditions can be set in a pinpoint manner when a bias circuit is provided in the OTP circuit illustrated in FIG. 5 in an OTP readout circuit according to a second embodiment.

FIG. 9 illustrates how data reading conditions can be set in a pinpoint manner when a bias circuit is provided in the OTP circuit 1a. FIG. 9 illustrates a relationship between the voltage Vgs and the program magnification. When the gate-source voltage Vgs gradually increases and reaches a predetermined voltage, the program magnification becomes maximum.

For this reason, when data programmed into the OTP memory transistor M0 is read out, the data is read out at a voltage at which the program magnification becomes approximately maximum, thereby making it possible to stabilize data readout. Further, since the data is read out at a voltage at which the program magnification becomes approximately maximum, it is possible to shorten the time taken to execute a program.

Figure 10:
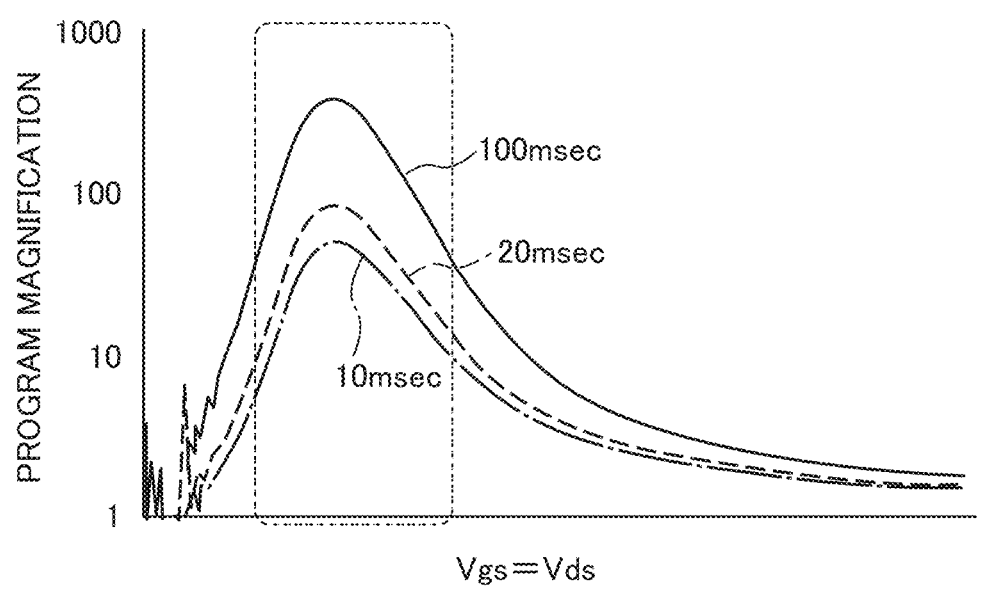
FIG. 10 is a diagram illustrating how reading conditions expand when a bias circuit is not provided in the OTP circuit illustrated in FIG. 5.

FIG. 10 illustrates how the data reading conditions expand when the bias circuit is not provided in the OTP circuit 1a.

Although several embodiments have been described as above, these embodiments are presented by way of example and are not intended to limit the scope of the invention. These new embodiments may be implemented in various other forms, and various omissions, substitutions, and modifications may be made without departing from the spirit and scope of the invention. These embodiments and modifications thereof are included in the scope and the gist of the invention, and are also included in the scope equivalent to the inventions described in claims.

What is claimed is:

1. An OTP (one time-programmable) readout circuit comprising,
   an OTP circuit having a first OTP cell in which data is programmable only once; and
   a readout-possible signal output unit configured to generate a readout-possible voltage for reading out the data, wherein
   the readout-possible voltage from the readout-possible signal output unit causes the OTP circuit to read out the data programmed into the first OTP cell, and
   the readout-possible signal output unit includes a second OTP cell having the same configuration as the first OTP cell provided in the OTP circuit.

2. The OTP readout circuit according to claim 1, wherein the readout-possible signal output unit includes a second constant current source from which a second constant current flows,
   the second OTP cell has a second transistor, and
   the readout-possible voltage generated by a current of the second constant current source flowing through the second transistor is output to the OTP circuit.

3. The OTP readout circuit according to claim 1, wherein the data programmed into the first OTP cell is trimming information.

4. The OTP readout circuit according to claim 1, wherein the data programmed into the first OTP cell is correction information of an external device.

5. An OTP (one time-programmable) readout circuit comprising,
   an OTP circuit having a first OTP cell in which data is programmable only once; and
   a readout-possible signal output unit configured to generate a readout-possible voltage for reading out the data, wherein
   the readout-possible voltage from the readout-possible signal output unit causes the OTP circuit to read out the data programmed into the first OTP cell, and
   the OTP circuit includes a first constant current source from which a first constant current flows,
   the first OTP cell includes:
   a first transistor in which a current is supplied from the first constant current source to a first gate and a first source is connected to ground via a first resistor; and
   a memory transistor in which a current is supplied from the first constant current source to a second gate and a second source is connected to ground,
   the first transistor and the memory transistor constitute a current mirror circuit and read out data programmed into the memory transistor.

6. The OTP readout circuit according to claim 5, wherein the first OTP cell includes:
   a first transistor in which a writing voltage is applied to a first gate and a first source is connected to ground via a first resistor; and
   a memory transistor in which the writing voltage is applied to a second gate and a second source, and a drain is connected to ground,
   the first transistor and the memory transistor constitute a current mirror circuit, and
   the data is programmed into the memory transistor by supplying a current being supplied to the memory transistor.

7. The OTP readout circuit according claim 5, wherein the OTP circuit causes a current to be supplied by the first constant current source, gradually increases a first threshold voltage of the first transistor and a second threshold voltage of the memory transistor which is greater than the first threshold voltage, and after a current flows through the first transistor, the OTP circuit reads out the data programmed into the memory transistor at a voltage at which a program magnification is approximately maximum, the program magnification representing a fluctuation rate of an amount of current before and after the data is programmed.

8. An OTP (one time-programmable) circuit comprising:
   a first OTP cell in which data is programmable only once; and
   a constant current source from which a constant current flows, wherein
   the first OTP cell includes:
   a first transistor in which a current is supplied from the constant current source to a first gate and a first source is connected to ground via a first resistor; and
   a memory transistor in which a current is supplied from the constant current source to a second gate and a second source is connected to ground,
   the first transistor and the memory transistor constitute a current mirror circuit, and the OTP circuit causes a current to be supplied by the constant current source, gradually increases a first threshold voltage of the first transistor and a second threshold voltage of the memory transistor which is greater than the first threshold voltage, and after a current flows through the first transistor, the OTP circuit reads out the data programmed into the memory transistor at a voltage at which a program magnification is approximately maximum, the program magnification representing a fluctuation rate of an amount of current before and after data is programmed.

* * * * *